US006582877B2

(12) United States Patent
Chang et al.

(10) Patent No.: US 6,582,877 B2
(45) Date of Patent: *Jun. 24, 2003

(54) LASER ADDRESSABLE THERMAL TRANSFER IMAGING ELEMENT WITH AN INTERLAYER

(75) Inventors: Jeffrey C. Chang, North Oaks, MN (US); John S. Staral, Woodbury, MN (US); William A. Tolbert, Woodbury, MN (US); Martin B. Wolk, Woodbury, MN (US); Claire A. Jalbert, Cottage Grove, MN (US); Hsin-hsin Chou, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/219,427

(22) Filed: Aug. 15, 2002

(65) Prior Publication Data

US 2003/0003390 A1 Jan. 2, 2003

Related U.S. Application Data

(60) Continuation of application No. 09/738,735, filed on Dec. 15, 2000, now Pat. No. 6,461,793, which is a continuation of application No. 09/553,294, filed on Apr. 20, 2000, now Pat. No. 6,270,934, which is a continuation of application No. 09/349,329, filed on Jul. 8, 1999, now Pat. No. 6,099,994, which is a continuation of application No. 09/031,941, filed on Feb. 27, 1998, now Pat. No. 5,981,136, which is a division of application No. 08/632,225, filed on Apr. 15, 1996, now Pat. No. 5,725,989.

(51) Int. Cl.$^7$ .............................. G03F 7/34; G03F 7/11
(52) U.S. Cl. ..................... 430/200; 430/201; 430/271.1
(58) Field of Search ................................ 430/200, 201, 430/271.1

(56) References Cited

U.S. PATENT DOCUMENTS

| | | |
|---|---|---|
| 3,795,814 A | 3/1974 | Rabatin |
| 3,859,527 A | 1/1975 | Luckey |
| 3,883,747 A | 5/1975 | Murashige et al. |
| 3,974,389 A | 8/1976 | Ferri et al. |
| 4,204,125 A | 5/1980 | Fatuzzo et al. |
| 4,225,653 A | 9/1980 | Brixner |
| 4,249,011 A | 2/1981 | Wendling |
| 4,252,671 A | 2/1981 | Smith |
| 4,258,264 A | 3/1981 | Kotera et al. |
| 4,261,854 A | 4/1981 | Kotera et al. |
| 4,262,072 A | 4/1981 | Wendling et al. |
| 4,387,141 A | 6/1983 | Patten |
| 4,405,691 A | 9/1983 | Yale |
| 4,430,366 A | 2/1984 | Crawford et al. |

(List continued on next page.)

FOREIGN PATENT DOCUMENTS

| | | |
|---|---|---|
| EP | 175 578 | 3/1986 |
| EP | 568 993 | 11/1993 |
| EP | 0 641 008 A1 | 1/1995 |
| GB | 2 083 726 A | 3/1982 |
| JP | 146447 | 11/1980 |
| JP | 55-163500 | 12/1980 |
| JP | 59-020466 | 2/1984 |
| JP | Sho 61-252501 | 11/1986 |
| JP | 62-67416 A | 3/1987 |
| JP | 62-95670 A | 5/1987 |
| JP | 63-60793 | 3/1988 |
| JP | 63089385 | 4/1988 |
| JP | 2-162095 | 12/1988 |
| JP | 64-14081 | 1/1989 |
| JP | 63-02270 A | 7/1989 |
| JP | Hei-104113 | 4/1993 |
| WO | WO 94/22674 | 10/1994 |
| WO | WO 95/13195 | 5/1995 |
| WO | WO 96/02010 | 1/1996 |

OTHER PUBLICATIONS

Irie et al. "Thermal Transfer . . . " *J of Imaging Sci. & Techn.* vol. 37, No. 3 May/Jun. 1993, pp 235–238.*
"Luminescent Materials", *Ullmann's Encyclopedia of Industrial Chemistry*, 5$^{th}$ Ed., vol. A15, p. 539–554 (1990).
Bello, K.A. et al., "Near–infrared–absorbing Squaraine Dyes containing 2,3–Dihydroperimidine Terminal Groups", *J. Chem. Socl, Chem–Commun.*, p. 452–4 (1993).
Chuang, T.J. et al., "Laser–Photoetching Characteristics of Polymers with Dopants", *Appl. Phys. A*, 45, p. 277–288 (1988).
Curtin, C., et al., *Fundamentals of Emissive Technology*, Society for Information Display.
Hase, T. et al., "Phosphor Materials for Cathode–Ray Tubes," *Advances in Electronic and Electron Physics*, Academic Press, Inc., New York, 79, 271 (1990).
Matsuoka, M. Absorption Spectra of Dyes For Diode Lasers, Bunshin Publishing Co., Tokyo, 1990.
Matsuoka, M. Infrared Absorbing Materials, Plenum Press, New York, 1990.
Mitsuru, I., et al., "Thermal Transfer Color Printing Using Laser Heating", *Journal of Imaging Science and Technology*, vol. 37, May/Jun. 1993.
Oki, K., et al., "A Phosphor Screen for High–Resolution CRTs", *Journal of the SID*, vol. 3, No. 51 (1995).
Raue, R., et al., "Phosphor Screens in CAthode–Ray Tubes for Projection Television", *Philips Tech. Rev.*, vol. 44, No. 11/12, p. 335–347 (Nov. 1989).

*Primary Examiner*—Richard L. Schilling

(57) ABSTRACT

A thermal transfer donor element is provided which comprises a support, a light-to-heat conversion layer, an interlayer, and a thermal transfer layer. When the above donor element is brought into contact with a receptor and imagewise irradiated, an image is obtained which is free from contamination by the light-to-heat conversion layer. The construction and process of this invention is useful in making colored images including applications such as color proofs and color filter elements.

20 Claims, No Drawings

U.S. PATENT DOCUMENTS

| | | |
|---|---|---|
| 4,598,207 A | 7/1986 | Naruse et al. |
| 4,599,298 A | 7/1986 | Fisch |
| 4,652,462 A | 3/1987 | Nishizawa et al. |
| 4,772,583 A | 9/1988 | Sprecker et al. |
| 4,822,643 A | 4/1989 | Chou et al. |
| 4,833,124 A | 5/1989 | Lum |
| 4,839,224 A | 6/1989 | Chou et al. |
| 4,912,083 A | 3/1990 | Chapman et al. |
| 4,940,640 A | 7/1990 | MacDiarmid |
| 4,942,141 A | 7/1990 | DeBoer et al. |
| 4,948,776 A | 8/1990 | Evans et al. |
| 4,948,777 A | 8/1990 | Evans et al. |
| 4,948,778 A | 8/1990 | DeBoer |
| 4,950,639 A | 8/1990 | DeBoer et al. |
| 4,952,552 A | 8/1990 | Chapman et al. |
| 4,973,572 A | 11/1990 | DeBoer |
| 5,023,229 A | 6/1991 | Evans et al. |
| 5,024,990 A | 6/1991 | Chapman et al. |
| 5,089,372 A | 2/1992 | Kirihata et al. |
| 5,124,564 A | 6/1992 | Fouassier et al. |
| 5,156,938 A | 10/1992 | Foley et al. |
| 5,164,224 A | 11/1992 | Kojima et al. |
| 5,166,024 A | 11/1992 | Bugner et al. |
| 5,171,650 A | 12/1992 | Ellis et al. |
| 5,256,506 A | 10/1993 | Ellis et al. |
| 5,278,023 A | 1/1994 | Bills et al. |
| 5,286,604 A | 2/1994 | Simmons, III |
| 5,296,117 A | 3/1994 | De Jaeger et al. |
| 5,302,423 A | 4/1994 | Tran et al. |
| 5,306,637 A | 4/1994 | Lin et al. |
| 5,308,737 A | 5/1994 | Bills et al. |
| 5,340,699 A | 8/1994 | Haley et al. |
| 5,351,617 A | 10/1994 | Williams et al. |
| 5,360,694 A | 11/1994 | Thien et al. |
| 5,401,606 A | 3/1995 | Reardon et al. |
| 5,401,607 A | 3/1995 | Takiff et al. |
| 5,501,937 A * | 3/1996 | Matsumoto et al. ........ 430/200 |
| 5,725,989 A * | 3/1998 | Chang et al. ............... 430/200 |
| 5,981,136 A * | 11/1999 | Chang et al. ............... 430/200 |
| 6,099,994 A * | 8/2000 | Chang et al. ............... 430/200 |
| 6,190,826 B1 | 2/2001 | Chang et al. |
| 6,270,934 B1 * | 8/2001 | Chang et al. ............... 430/200 |
| 6,461,793 B2 * | 10/2002 | Chang et al. ............... 430/200 |

* cited by examiner

LASER ADDRESSABLE THERMAL TRANSFER IMAGING ELEMENT WITH AN INTERLAYER

This is a continuation of Ser. No. 09/738,735, filed Dec. 15, 2000, now U.S. Pat. No. 6,461,793 which is a continuation of Ser. No. 09/553,294, now U.S. Pat. No. 6,270,934, filed Apr. 20, 2000, which is a continuation of Ser. No. 09/349,329, now U.S. Pat. No. 6,099,994, filed Jul. 8, 1999, which is a continuation of Ser. No. 09/031,941, now U.S. Pat. No. 5,981,136, filed Feb. 27, 1998, which is a divisional of Ser. No. 08/632,225, now U.S. Pat. No. 5,725,989, filed Apr. 15, 1996.

FIELD OF INVENTION

This invention relates to thermal transfer imaging elements, in particular, to laser addressable thermal transfer elements having an interlayer between a radiation-absorbing/thermal conversion layer and a transferable layer. In addition, the invention relates to a method of using the thermal transfer element in a thermal transfer system such as a laser addressable system.

BACKGROUND

With the increase in electronic imaging information capacity and use, a need for imaging systems capable of being addressed by a variety of electronic sources is also increasing. Examples of such imaging systems include thermal transfer, ablation (or transparentization) and ablation-transfer imaging. These imaging systems have been shown to be useful in a wide variety of applications, such as, color proofing, color filter arrays for liquid crystal display devices, printing plates, and reproduction masks. The traditional method of recording electronic information with a thermal transfer imaging medium utilizes a thermal printhead as the energy source. The information is transmitted as electrical energy to the printhead causing a localized heating of a thermal transfer donor sheet which then transfers material corresponding to the image data to a receptor sheet. The two primary types of thermal transfer donor sheets are dye sublimation (or dye diffusion transfer) and thermal mass transfer. Representative examples of these types of imaging systems can be found in U.S. Pat. Nos. 4,839,224 and 4,822,643. The use of thermal printheads as an energy source suffers several disadvantages, such as, size limitations of the printhead, slow image recording speeds (milliseconds), limited resolution, limited addressability, and artifacts on the image from detrimental contact of the media with the printhead.

The increasing availability and use of higher output compact lasers, semiconductor light sources, laser diodes and other radiation sources which emit in the ultraviolet, visible and particularly in the near-infrared and infrared regions of the electromagnetic spectrum, have allowed the use of these sources as viable alternatives for the thermal printhead as an energy source. The use of a radiation source such as a laser or laser diode as the imaging source is one of the primary and preferred means for transferring electronic information onto an image recording media. The use of radiation to expose the media provides higher resolution and more flexibility in format size of the final image than the traditional thermal printhead imaging systems. In addition, radiation sources such as lasers and laser diodes provide the advantage of eliminating the detrimental effects from contact of the media with the heat source. As a consequence, a need exists for media that have the ability to be efficiently exposed by these sources and have the ability to form images having high resolution and improved edge sharpness.

It is well known in the art to incorporate light-absorbing layers in thermal transfer constructions to act as light-to-heat converters, thus allowing non-contact imaging using radiation sources such as lasers and laser diodes as energy sources. Representative examples of these types of elements can be found in U.S. Pat. Nos. 5,308,737; 5,278,023; 5,256, 506; and 5,156,938. The transfer layer may contain light absorbing materials such that the transfer layer itself functions as the light-to-heat conversion layer. Alternatively, the light-to-heat conversion layer may be a separate layer, for instance, a separate layer between the substrate and the transfer layer. Constructions in which the transfer layer itself functions as the light-to-heat conversion layer may require the addition of an additive to increase the absorption of incident radiation and effect transfer to a receptor. In these cases, the presence of the absorber in the transferred image may have a detrimental effect upon the performance of the imaged object (e.g., visible absorption which reduces the optical purity of the colors in the transferred image, reduced transferred image stability, incompatibility between the absorber and other components present in the imaging layer, etc.).

Contamination of the transferred image by the light-to-heat conversion layer itself is often observed when using donor constructions having a separate light-to-heat conversion layer. In the cases where contamination of the transferred image by such unintended transfer of the light-to-heat conversion layer occurs and the light-to-heat conversion layer possesses an optical absorbance that interferes with the performance of the transferred image (e.g., transfer of a portion of a black body light-to-heat conversion layer to a color filter array or color proof), the incidental transfer of the light-to-heat conversion layer to the receptor is particularly detrimental to quality of the imaged article. Similarly, mechanical or thermal distortion of the light-to-heat conversion layer during imaging is common and negatively impacts the quality of the transferred coating. U.S. Pat. No. 5,171,650 discloses methods and materials for thermal imaging using an "ablation-transfer" technique. The donor element used in the imaging process comprises a support, an intermediate dynamic release layer, and an ablative carrier topcoat containing a colorant. Both the dynamic release layer and the color carrier layer may contain an infrared-absorbing (light to heat conversion) dye or pigment. A colored image is produced by placing the donor element in intimate contact with a receptor and then irradiating the donor with a coherent light source in an imagewise pattern. The colored carrier layer is simultaneously released and propelled away from the dynamic release layer in the light struck areas creating a colored image on the receptor.

Co-pending U.S. application Ser. No. 07/855,799 filed Mar. 23, 1992 discloses ablative imaging elements comprising a substrate coated on a portion thereof with an energy sensitive layer comprising a glycidyl azide polymer in combination with a radiation absorber. Demonstrated imaging sources included infrared, visible, and ultraviolet lasers. Solid state lasers were disclosed as exposure sources, although laser diodes were not specifically mentioned. This application is primarily concerned with the formation of relief printing plates and lithographic plates by ablation of the energy sensitive layer. No specific mention of utility for thermal mass transfer was made.

U.S. Pat. No. 5,308,737 discloses the use of black metal layers on polymeric substrates with gas-producing polymer layers which generate relatively high volumes of gas when irradiated. The black metal (e.g., black aluminum) absorbs the radiation efficiently and converts it to heat for the gas-generating materials. It is observed in the examples that in some cases the black metal was eliminated from the substrate, leaving a positive image on the substrate.

U.S. Pat. No. 5,278,023 discloses laser-addressable thermal transfer materials for producing color proofs, printing plates, films, printed circuit boards, and other media. The materials contain a substrate coated thereon with a propellant layer wherein the propellant layer contains a material capable of producing nitrogen ($N_2$) gas at a temperature of preferably less than about 300° C.; a radiation absorber; and a thermal mass transfer material. The thermal mass transfer material may be incorporated into the propellant layer or in an additional layer coated onto the propellant layer. The radiation absorber may be employed in one of the above-disclosed layers or in a separate layer in order to achieve localized heating with an electromagnetic energy source, such as a laser. Upon laser induced heating, the transfer material is propelled to the receptor by the rapid expansion of gas. The thermal mass transfer material may contain, for example, pigments, toner particles, resins, metal particles, monomers, polymers, dyes, or combinations thereof. Also disclosed is a process for forming an image as well as an imaged article made thereby.

Laser-induced mass transfer processes have the advantage of very short heating times (nanoseconds to microseconds); whereas, the conventional thermal mass transfer methods are relatively slow due to the longer dwell times (milliseconds) required to heat the printhead and transfer the heat to the donor. The transferred images generated under laser-induced ablation imaging conditions are often fragmented (being propelled from the surface as particulates or fragments). The images from thermal melt stick transfer systems tend to show deformities on the surface of the transferred material. Therefore, there is a need for a thermal transfer system that takes advantage of the speed and efficiency of laser addressable systems without sacrificing image quality or resolution.

SUMMARY OF THE INVENTION

The present invention relates to a thermal transfer element comprising a substrate having deposited thereon (a) a light-to-heat conversion layer, (b) an interlayer, and (c) a thermal transfer layer. The thermal transfer layer may additionally comprise crosslinkable materials.

The present invention also provides a method for generating an image on a receptor using the above described thermal transfer element. An image is transferred onto a receptor by (a) placing in intimate contact a receptor and the thermal transfer element described above, (b) exposing the thermal transfer element in an imagewise pattern with a radiation source, and (c) transferring the thermal transfer layer corresponding to the imagewise pattern to the receptor, with insignificant or no transfer of the light-to-heat conversion layer. When the thermal transfer layer contains crosslinkable materials, an additional curing step may be performed where the transferred image is subsequently crosslinked by exposure to heat or radiation, or treatment with chemical curatives.

The phrase "in intimate contact" refers to sufficient contact between two surfaces such that the transfer of materials may be accomplished during the imaging process to provide a sufficient transfer of material within the thermally addressed areas. In other words, no voids are present in the imaged areas which would render the transferred image non-functional in its intended application.

Other aspects, advantages, and benefits of the present invention are apparent from the detailed description, the examples, and the claims.

DETAILED DESCRIPTION OF INVENTION

A thermal transfer element is provided comprising a light transparent substrate having deposited thereon, in the following order, a light-to-heat conversion (LTHC) layer, a heat stable interlayer, and a thermal transfer layer. The substrate is typically a polyester film, for example, poly(ethylene terephthalate) or poly(ethylene naphthalate). However, any film that has appropriate optical properties and sufficient mechanical stability can be used.

Light-to-Heat Conversion Layer

In order to couple the energy of the exposure source into the imaging construction it is especially desirable to incorporate a light-to-heat conversion (LTHC) layer within the construction. The LTHC layer comprises a material which absorbs at least at the wavelength of irradiation and converts a portion of the incident radiation into sufficient heat to enable transfer the thermal transfer layer from the donor to the receptor. Typically, LTHC layers will be absorptive in the infrared region of the electromagnetic spectrum, but in some instances visible or ultraviolet absorptions may be selected. It is generally desirable for the radiation absorber to be highly absorptive of the imaging radiation, enabling an optical density at the wavelength of the imaging radiation in the range of 0.2 to 3.0 using a minimum amount of radiation absorber to be used.

Dyes suitable for use as radiation absorbers in a LTHC layer may be present in particulate form or preferably substantially in molecular dispersion. Especially preferred are dyes absorbing in the IR region of the spectrum. Examples of such dyes may be found in Matsuoka, M., Infrared Absorbing Materials, Plenum Press, New York, 1990, and in Matsuoka, M., Absorption Spectra of Dyes for Diode Lasers, Bunshin Publishing Co., Tokyo, 1990. IR absorbers marketed by American Cyanamid or Glendale Protective Technologies, Inc., Lakeland, Fla., under the designation CYASORB IR-99, IR-126 and IR-165 may also be used. Such dyes will be chosen for solubility in, and compatibility with, the specific polymer and coating solvent in question.

Pigmentary materials may also be dispersed in the LTHC layer for use as radiation absorbers. Examples include carbon black and graphite as well as phthalocyanines, nickel dithiolenes, and other pigments described in U.S. Pat. Nos. 5,166,024 and 5,351,617. Additionally, black azo pigments based on copper or chromium complexes of, for example, pyrazolone yellow, dianisidine red, and nickel azo yellow are useful. Inorganic pigments are also valuable. Examples include oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead or tellurium. Metal borides, carbides, nitrides, carbonitrides, bronze-structured oxides, and oxides structurally related to the bronze family (e.g. $WO_{2.9}$) are also of utility.

When dispersed particulate radiation absorbers are used, it is preferred that the particle size be less than about 10 micrometers, and especially preferred that the particle size be less than about 1 micrometer. Metals themselves may be employed, either in the form of particles, as described for instance in U.S. Pat. No. 4,252,671, or as films as disclosed in U.S. Pat. No. 5,256,506. Suitable metals include aluminum, bismuth, tin, indium, tellurium and zinc.

Suitable binders for use in the LTHC layer include film-forming polymers, such as for example, phenolic resins (i.e., novolak and resole resins), polyvinyl butyral resins, polyvinylacetates, polyvinyl acetals, polyvinylidene chlorides, polyacrylates, cellulosic ethers and esters, nitrocelluloses, and polycarbonates. The absorber-to-binder ratio is generally from 5:1 to 1:100 by weight depending on what type of absorbers and binders are used. Conventional coating aids, such as surfactants and dispersing agents, may be added to facilitate the coating process. The LTHC layer may be coated onto the substrate using a variety of coating methods known in the art. The LTHC layer is coated to a thickness of 0.001 to 20.0 micrometers, preferably 0.01 to 5.0 micrometers. The desired thickness of the LTHC layer will depend upon the composition of the layer. A preferred LTHC layer is a pigment/binder layer. A particularly preferred pigment based LTHC layer is carbon black dispersed in an organic polymeric binder. Alternatively, other preferred LTHC layers include metal or metal/metal oxide layers (e.g. black aluminum which is a partially oxidized aluminum having a black visual appearance).

Interlayer Construction

The interlayer may comprise an organic and/or inorganic material. In order to minimize damage and contamination of the resultant transferred image, the interlayer should have high thermal resistance. Preferably, the layer should not visibly distort or chemically decompose at temperatures below 150° C. These properties may be readily provided by polymeric film (thermoplastic or thermoset layers), metal layers (e.g., vapor deposited metal layers), inorganic layers (e.g., sol-gel deposited layers, vapor deposited layers of inorganic oxides [e.g., silica, titania, etc., including metal oxides]), and organic/inorganic composite layers (thermoplastic or thermoset layers). Organic materials suitable as interlayer materials include both thermoset (crosslinked) and thermoplastic materials. In both cases, the material chosen for the interlayer should be film forming and should remain substantially intact during the imaging process. This can be accomplished by the proper selection of materials based on their thermal and/or mechanical properties. As a guideline, the $T_g$ of the thermoplastic materials should be greater than 150° C., more preferably greater than 180° C. The interlayer may be either transmissive, absorbing, reflective, or some combination thereof at the imaging radiation wavelength.

The surface characteristics of the interlayer will depend on the application for which the imaged article is to be used. Frequently, it will be desirable to have an interlayer with a "smooth" surface so as not to impart adverse texture to the surface of the thermally transferred layer. This is especially important for applications requiring rigid dimensional tolerances such as for color filter elements for liquid crystal displays. However, for other applications surface "roughness" or "surface patterns" may be tolerable or even desirable.

The interlayer provides a number of desirable benefits. The interlayer is essentially a barrier against the transfer of material from the light-to-heat conversion layer. The interlayer can also prevent distortion of the transferred thermal transfer layer material. It may also modulate the temperature attained in the thermal transfer layer so that more thermally unstable materials can be transferred and may also result in improved plastic memory in the transferred material. It is also to be noted that the interlayer of the present invention, when placed over the LTHC layer, is incompatible with propulsively ablative systems like those of U.S. Pat. Nos. 5,156,938; 5,171,650; and 5,256,506 because the interlayer would act as a barrier to prevent propulsive forces from the LTHC layer from acting on the thermal transfer layer. The gas-generating layers disclosed in those patents also would not qualify as interlayers according to the present invention, as those layers must be thermally unstable at the imaging temperatures to decompose and generate the gas to propel material from the surface.

Suitable thermoset resins include materials which may be crosslinked by thermal, radiation, or chemical treatment including, but not limited to, crosslinked poly(meth) acrylates, polyesters, epoxies, polyurethanes, etc. For ease of application, the thermoset materials are usually coated onto the light-to-heat conversion layer as thermoplastic precursors and subsequently crosslinked to form the desired crosslinked interlayer.

In the case of thermoplastic materials, any material which meets the above-mentioned functional criteria may be employed as an interlayer material. Accordingly, the preferred materials will possess chemical stability and mechanical integrity under the imaging conditions. Classes of preferred thermoplastic materials include polysulfones, polyesters, polyimides, etc. These thermoplastic organic materials may be applied to the light-to-heat conversion layer via conventional coating techniques (solvent coating, etc.).

In the cases of interlayers comprised of organic materials, the interlayers may also contain appropriate additives including photoinitiators, surfactants, pigments, plasticizers, coating aids, etc. The optimum thickness of an organic interlayer is material dependent and, in general, will be the minimum thickness at which transfer of the light-to-heat conversion layer and distortion of the transferred layer are reduced to levels acceptable for the intended application (which will generally be between 0.05 $\mu$m and 10 $\mu$m).

Inorganic materials suitable as interlayer materials include metals, metal oxides, metal sulfides, inorganic carbon coatings, etc., including those which are highly transmissive or reflective at the imaging laser wavelength. These materials may be applied to the light-to-heat-conversion layer via conventional techniques (e.g., vacuum sputtering, vacuum evaporation, plasma jet, etc.). The optimum thickness of an inorganic interlayer will again be material dependent. The optimum thickness will be, in general, the minimum thickness at which transfer of the light-to-heat conversion layer and distortion of the transferred layer are reduced to an acceptable level (which will generally be between 0.01 $\mu$m and 10 $\mu$m).

In the case of reflective interlayers, the interlayer comprises a highly reflective material, such as aluminum or coatings of $TiO_2$ based inks. The reflective material should be capable of forming an image-releasing surface for the overlying colorant layer and should remain intact during the colorant coating process. The interlayer should not melt or transfer under imaging conditions. In the case where imaging is performed via irradiation from the donor side, a reflective interlayer will attenuate the level of imaging radiation transmitted through the interlayer and thereby reduce any damage to the resultant image that might result from interaction of the transmitted radiation with the transfer layer and/or receptor. This is particularly beneficial in reducing thermal damage to the transferred image which might occur when the receptor is highly absorptive of the imaging radiation. Optionally, the thermal transfer donor element may comprise several interlayers, for example, both a reflective and transmissive interlayer, the sequencing of which would be dependent upon the imaging and end-use application requirements.

Suitable highly reflective metallic films include aluminum, chrome, and silver. Suitable pigment based inks include standard white pigments such as titanium dioxide, calcium carbonate, and barium sulfate used in conjunction with a binder. The binder may be either a thermoplastic or thermoset material. Preferred binders include high $T_g$ resins such as polysulfones, polyarylsulfones, polyarylethersulfones, polyetherimides, polyarylates, polyimides, polyetheretherketones, and polyamideimides (thermoplastics) and polyesters, epoxies, polyacrylates, polyurethanes, phenol-formaldehydes, urea-formaldehydes, and melamine-formaldehydes (thermosets), etc.

Polymerizable or crosslinkable monomers, oligomers, prepolymers and polymers may be used as binders and crosslinked to form the desired heat-resistant, reflective interlayer after the coating process. The monomers, oligomers, prepolymers and polymers that are suitable for this application include known chemicals that can form a heat resistant polymeric layer. The layer may also contain additives such as crosslinkers, surfactants, coating aids, and pigments.

The reflective layer thickness can be optimized with respect to imaging performance, sensitivity, and surface smoothness. Normally the thickness of the interlayer is 0.005 to 5 microns, preferably between 0.01 to 2.0 microns. Optionally, the reflective interlayer may be overcoated with a non-pigmented polymeric interlayer to allow a better release of color image.

Thermal Transfer Layer

The transfer layer is formulated to be appropriate for the corresponding imaging application (e.g., color proofing, printing plate, color filters, etc.). The transfer layer may itself be comprised of thermoplastic and/or thermoset materials. In many product applications (for example, in printing plate and color filter applications) the transfer layer materials are preferably crosslinked after laser transfer in order to improve performance of the imaged article. Additives included in the transfer layer will again be specific to the end-use application (e.g., colorants for color proofing and color filter applications, photoinitiators for photo-crosslinked or photo-crosslinkable transfer layers, etc.,) and are well known to those skilled in the art.

Because the interlayer can modulate the temperature attained in the thermal transfer layer, materials which tend to be more sensitive to heat than typical pigments may be transferred with reduced damage using the process of the present invention. For example, medical diagnostic chemistry can be included in a binder and transferred to a medical test card using the present invention with less likelihood of damage to the medical chemistry and less possibility of corruption of the test results. A chemical or enzymatic indicator would be less likely to be damaged using the present invention with an interlayer compared to the same material transferred from a conventional thermal donor element.

The thermal transfer layer may comprise classes of materials including, but not limited to dyes (e.g., visible dyes, ultraviolet dyes, fluorescent dyes, radiation-polarizing dyes, IR dyes, etc.), optically active materials, pigments (e.g., transparent pigments, colored pigments, black body absorbers, etc.), magnetic particles, electrically conducting or insulating particles, liquid crystal materials, hydrophilic or hydrophobic materials, initiators, sensitizers, phosphors, polymeric binders, enzymes, etc. For many applications such as color proofing and color filter elements, the thermal transfer layer will comprise colorants. Preferably the thermal transfer layer will comprise at least one organic or inorganic colorant (i.e., pigments or dyes) and a thermoplastic binder. Other additives may also be included such as an IR absorber, dispersing agents, surfactants, stabilizers, plasticizers, crosslinking agents and coating aids. Any pigment may be used, but for applications such as color filter elements, preferred pigments are those listed as having good color permanency and transparency in the NPIRI Raw Materials Data Handbook, Volume 4 (Pigments) or W. Herbst, Industrial Organic Pigments, VCH, 1993. Either non-aqueous or aqueous pigment dispersions may be used. The pigments are generally introduced into the color formulation in the form of a millbase comprising the pigment dispersed with a binder and suspended into a solvent or mixture of solvents. The pigment type and color are chosen such that the color coating is matched to a preset color target or specification set by the industry. The type of dispersing resin and the pigment-to-resin ratio will depend upon the pigment type, surface treatment on the pigment, dispersing solvent and milling process used in generating the millbase. Suitable dispersing resins include vinyl chloride/vinyl acetate copolymers, poly(vinyl acetate)/crotonic acid copolymers, polyurethanes, styrene maleic anhydride half ester resins, (meth)acrylate polymers and copolymers, poly (vinyl acetals), poly(vinyl acetals) modified with anhydrides and amines, hydroxy alkyl cellulose resins and styrene acrylic resins. A preferred color transfer coating composition comprises 30–80% by weight pigment, 15–60% by weight resin, and 0–20% by weight dispersing agents and additives.

The amount of binder present in the color transfer layer is kept to a minimum to avoid loss of image resolution and/or imaging sensitivity due to excessive cohesion in the color transfer layer. The pigment-to-binder ratio is typically between 10:1 to 1:10 by weight depending on the type of pigments and binders used. The binder system may also include polymerizable and/or crosslinkable materials (i.e., monomers, oligomers, prepolymers, and/or polymers) and optionally an initiator system. Using monomers or oligomers assists in reducing the binder cohesive force in the color transfer layer, therefore improving imaging sensitivity and/or transferred image resolution. Incorporation of a crosslinkable composition into the color transfer layer allows one to produce a more durable and solvent resistant image. A highly crosslinked image is formed by first transferring the image to a receptor and then exposing the transferred image to radiation, heat and/or a chemical curative to crosslink the polymerizable materials. In the case where radiation is employed to crosslink the composition, any radiation source can be used that is absorbed by the transferred image. Preferably the composition comprises a composition which may be crosslinked with an ultraviolet radiation source.

The color transfer layer may be coated by any conventional coating method known in the art. It may be desirable to add coating aids such as surfactants and dispersing agents to provide an uniform coating. Preferably, the layer has a thickness from about 0.05 to 10.0 micrometers, more preferably from 0.5 to 2.0 micrometers.

Receiver

The image receiving substrate may be any substrate suitable for the application including, but not limited to, various papers, transparent films, LCD black matrices, active portions of LCD displays, metals, etc. Suitable receptors are well known to those skilled in the art. Non-limiting examples of receptors which can be used in the present invention include anodized aluminum and other metals, transparent plastic films (e.g., PET), glass, and a variety of different types of paper (e.g., filled or unfilled, calendered, coated, etc.). Various layers (e.g., an adhesive layer) may be coated onto the image receiving substrate to facilitate transfer of the transfer layer to the receiver.

Imaging Process

The process of the present invention may be performed by fairly simple steps. During imaging, the donor sheet is brought into intimate contact with a receptor sheet under pressure or vacuum. A radiation source is then used to heat the LTHC layer in an imagewise fashion (e.g., digitally, analog exposure through a mask, etc.) or to perform imagewise transfer of the thermal transfer layer from the donor to the receptor.

The interlayer reduces the transfer of the LTHC layer to the receptor and/or reduces distortion in the transferred layer. Without this interlayer in thermal mass transfer processes addressed by radiation sources, the topography of the transfer surface from the light-to-heat conversion layer may be observably altered. A significant topography of deformations and wrinkles may be formed. This topography may be imprinted on the transferred donor material. This imprinting of the image alters the reflectivity of the transferred image (rendering it less reflective than intended) and can cause other undesirable visual effects. It is preferred that under imaging conditions, the adhesion of the interlayer to the LTHC layer be greater than the adhesion of the interlayer to the thermal transfer layer. In the case where imaging is performed via irradiation from the donor side, a reflective interlayer will attenuate the level of imaging radiation transmitted through the interlayer and thereby reduce any transferred image damage that may result from interaction of the transmitted radiation with the transfer layer and/or the receptor. This is particularly beneficial in reducing thermal damage which may occur to the transferred image when the receptor is highly absorptive of the imaging radiation.

A variety of light-emitting sources can be utilized in the present invention. Infrared, visible, and ultraviolet lasers are particularly useful when using digital imaging techniques. When analog techniques are used (e.g., exposure through a mask) high powered light sources (e.g, xenon flash lamps, etc.) are also useful. Preferred lasers for use in this invention include high power (>100 mW) single mode laser diodes, fiber-coupled laser diodes, and diode-pumped solid state lasers (e.g., Nd:YAG and Nd:YLF). Laser exposure dwell times should be from about 0.1 to 5 microseconds and laser fluences should be from about 0.01 to about 1 Joules/cm$^2$.

During laser exposure, it may be desirable to minimize formation of interference patterns due to multiple reflections from the imaged material. This can be accomplished by various methods. The most common method is to effectively roughen the surface of the donor material on the scale of the incident radiation as described in U.S. Pat. No. 5,089,372. This has the effect of disrupting the spatial coherence of the incident radiation, thus minimizing self interference. An alternate method is to employ the use of an antireflection coating on the second interface that the incident illumination encounters. The use of anti-reflection coatings is well known in the art, and may consist of quarter-wave thicknesses of a coating such as magnesium fluoride, as described in U.S. Pat No. 5,171,650. Due to cost and manufacturing constraints, the surface roughening approach is preferred in many applications.

The following non-limiting examples further illustrate the present invention.

EXAMPLES

Materials used in the following examples are available from standard commercial sources such as Aldrich Chemical Co. (Milwaukee, Wis.) unless otherwise specified. The preparation of hydantoin hexacrylate used in Example 2 is described for Compound A in U.S. Pat. Nos. 4,249,011 and 4,262,072.

Laser Imaging Procedure A

The colorant coating side of a thermal transfer donor was held in intimate contact with a 75 mm×50 mm×1 mm glass slide (receptor) in a vacuum chuck such that the laser was incident upon the substrate (PET) side of the donor and normal to the donor/receptor surface. The vacuum chuck was attached to an X-Y translation stage such that it could be scanned in the plane of the donor/receptor surface, allowing laser exposure over the entire surface. A CW (continuous wave) Nd:YAG laser system was used for exposure, providing up to 14.5 Watts at 1064 nm in the film plane. The laser had a Gaussian spatial profile with the spot size tailored using external optics. An acoustic-optic modulator allowed control of the laser power from ~0 to 80%, the laser pulse width from ~20 ns to CW. The X-Y stage and laser power, pulse width and repetition rate were computer controlled allowing programmed patterns to be imaged.

Laser Imaging Procedure B

The colorant coating side of a thermal transfer donor was held in intimate contact with a 75 mm×50 mm×1 mm glass slide (receptor) in a vacuum chuck such that the laser was incident upon the substrate (PET) side of the donor. The vacuum chuck was attached to a one dimensional translation stage such that it could be scanned in the plane of the donor/receptor surface, allowing laser exposure over the entire surface. An optical system comprised of a CW Nd:YAG laser, acousto-optic modulator, collimating and beam expanding optics, an optical isolator, a linear galvanometer and an f-theta scan lens was utilized. The Nd:YAG laser was operating in the TEM 00 mode, and produced a total power of 7.5 Watts on the image plane. Scanning was accomplished with the high precision linear Cambridge Technology Galvonometer. The laser was focused to a Gaussian spot with a measured diameter of 140 microns at the $1/e^2$ intensity level. The spot was held constant across the scan width by utilizing an f-theta scan lens. The laser spot was scanned across the image surface at a velocity of 7.92 meters/second. The f-theta scan lens held the scan velocity uniform to within 0.1%, and the spot size constant to within ±3 microns.

Example 1

(Comparative Example)

This example demonstrates the preparation and use of a thermal transfer donor without an interlayer.

A black aluminum (partially oxidized Al, $AlO_x$) light-to-heat conversion layer with a transmission optical density (TOD=-logT, where T is the measured fractional transmission) of 0.53 at 1060 nm was coated onto a 4 mil poly(ethylene terephthalate) (PET) substrate via reactive sputtering of Al in an $Ar/O_2$ atmosphere in a continuous vacuum coater according to the teachings of U.S. Pat. No. 4,430,366. This $AlO_x$ light-to-heat conversion layer was then overcoated with a red color ink with 26.5 weight % total nonvolatiles content (CRY-S089, produced by Fuji-Hunt Electronics Technology Co., LTD, Tokyo, Japan) using a #5 coating rod and dried to produce a thermal transfer donor.

This donor was then tested for transfer of the thermal transfer layer to a glass slide receptor, which had been precoated with a vinyl acrylic copolymer (Wallpol 40148-00, Reichhold Chemicals, Inc. Research Triangle Park, N.C.). The above-described Laser Imaging Procedure A was employed, the laser spot size diameter ($1/e^2$) was 100 μm, the power at the film plane was 8.4 Watts, and exposures were performed at pulse widths of 4, 6, 8 and 10 microseconds.

The results showed that, although color images were formed on the receptor at the four different pulse widths, the images were discolored. A microscopic examination of the images revealed that the red color images were contaminated with the black aluminum light-to-heat conversion layer which had transferred from the donor.

Example 2

This example demonstrates the preparation and use of a thermal transfer donor with a thermoset interlayer.

The same black aluminum light-to-heat conversion layer referenced in Example 1 was coated with a 5 weight % solution of hydantoin hexacrylate (49 parts by weight), 1,6-hexanediol diacrylate (49 parts by weight) and 2,2-dimethoxy-2-phenylacetophenone (2 parts by weight) in 2-butanone using a #5 coating rod, dried and then radiation crosslinked via exposure in a Radiation Polymer Corporation (Plainfield, Ill.) UV Processor Model No. QC 1202AN3TR. (medium pressure uv lamp, total exposure ca. 100 millijoules/cm$^2$, $N_2$ atmosphere) to produce an interlayer. The cured interlayer was smooth, non-tacky, and resistant to many organic solvents including 2-butanone. The cured interlayer was then overcoated with the same red color ink employing the same coating procedures as described in Example 1.

The resulting donor was tested for transfer of the thermal transfer layer to a glass slide receptor employing laser imaging conditions identical to those described in Example 1.

A microscopic examination of the images on the receptor clearly indicated that the red color images were free of black aluminum contamination. The same microscopic examination of the imaged area of the donor showed that the interlayer and black aluminum light-to-heat conversion layer remained intact on the thermal transfer donor.

Example 3

This example demonstrates the preparation and use of a thermal transfer donor with a thermoplastic interlayer.

The same black aluminum light-to-heat conversion layer referenced in Example 1 was coated with a 10 weight % solution of Radel A-100 polysulfone resin (Amoco Performance Products, Inc., Alpharetta, Ga.) in 1,1,2-trichloroethane using a #12 coating rod. The Kadel A-100 interlayer was then overcoated with the same red color ink and employing the same coating procedures as described in Example 1.

The resulting donor was tested for transfer of the thermal transfer layer to a glass slide receptor employing laser imaging conditions identical to that described in Example 1. The results again showed that the color images were formed on the receptor at the four different pulse widths. A microscopic examination of the images on the receptor clearly indicated that the red color images were free of black aluminum contamination. The same microscopic examination of the imaged area of the donor showed again that the interlayer and black aluminum light-to-heat conversion layer remained intact on the thermal transfer donor.

Example 4

This example demonstrates the preparation and use of a thermal transfer donor with an inorganic interlayer.

A black aluminum ($AlO_x$) coating was deposited onto 4 mil poly(ethylene terephthalate) (PET) substrate via evaporation oral in a partial $O_2$ atmosphere according to the teachings of U.S. Pat. No. 4,430,366. The transmission and reflection spectra of the resultant coating on PET were measured from both the black aluminum coating side and the substrate (PET) side using a Shimadzu MPC-3100 spectrophotometer with an integrating sphere (Shimadzu Scientific Instruments, Inc., Columbia, Md.). The transmission optical densities (TOD=−logT, where T is the measured fractional transmission) and reflection optical densities (ROD=−logR, where R is the measured fractional reflectance) at 1060 nm are listed in Table 1. The thickness of the black aluminum coating was determined to be 1100 Å by profilometry after masking and etching a portion of the coating with 20 percent by weight aqueous sodium hydroxide.

TABLE 1

| Side of Incident Beam | TOD (at 1060 nm) | ROD (at 1060 nm) |
|---|---|---|
| Coating | 1.047 | 0.427 |
| Substrate | 1.050 | 0.456 |

An alumina interlayer (approximately 1000 Å thick) was coated onto the black aluminum surface by evaporation of $Al_2O_3$ in a vacuum coater.

A colorant coating solution was prepared by combining and mixing 2 grams of 10 weight % Heucotech GW3451 Lot 3F2299 PG 7 binderless pigment dispersion (Heucotech, Ltd., Fairless Hills, Pa.), 0.917 grams deionized $H_2O$, 0.833 grams of 18 weight % Elvacite® 2776 in water (prepared by mixing 0.8 g of a 25% ammonia solution and 22 g water, and 5 g of Elvacite® 2776 from ICI Acrylics, Wilmington, Del.) and 10 drops of a 1 weight % solution of FC-170C fluorochemical surfactant (3M, St. Paul, Minn.). This green coating solution was coated onto the alumina surface using a #4 coating rod. The resultant green donor media was dried at 50° C. for 2 minutes. The same green solution was coated onto the black aluminum ($AlO_x$) surface of the light-to-heat conversion film that did not have the alumina interlayer using #4 coating rod. The resultant green donor media was dried at 50° C. for 2 minutes.

These two donors, one with an alumina interlayer and the other without, were imaged onto glass receptors to make color filter elements for a liquid crystal display via laser induced thermal transfer imaging (LITI) utilizing the above-described Laser Imaging Procedure A. For these experiments, the laser spot diameter size ($1/e^2$) was 100 μm, the power at the film plane was 4.2 Watts, and the pulse width was 8 μsec. The amount of black aluminum contamination of the resultant color filters was then quantified via digitizing micrographs of the corresponding color filters and subsequent image analysis with IPLAB Spectrum-NV (Signal Analytics Corp., Vienna, Va.). The analyses indicate that the average area of the black aluminum light-to-heat conversion layer transferred to the receptor per imaged spot was 4 μm$^2$ black aluminum contamination per spot for the sample with the alumina interlayer vs. 125 μm$^2$ for the sample with no interlayer.

These results demonstrate the efficacy of the interlayer in improving transferred image quality and preventing image contamination with the light-to-heat conversion layer.

Example 5

This example demonstrates the preparation and use of a thermal transfer donor with a thermoset interlayer and a crosslinkable transfer layer.

A carbon black light-to-heat conversion layer was prepared by coating an aqueous dispersion of carbon black in a radiation curable resin onto a 2 mil PET substrate with a Yasui Seiki Lab Coater, Model CAG-150 (Yasui Seiki Co., Bloomington, Ind.) using a microgravure roll of 90 helical cells per lineal inch. The coating was subsequently in-line dried and uv-cured on the coater before windup. The coating solution consisted of 16.78 weight % of a urethane-acrylate oligomer (Neorad NR-440 from Zeneca Resins, Wilmington, Mass.), 0.84 weight % of 2-hydroxy-2-methyl-1-phenyl-1-propanone photoinitiator (Darocur 1173, Ciba-Geigy, Hawthorne, N.Y.), 2.38 weight % of carbon black (Sunsperse Black 7, Sun Chemical, Amelia, Ohio), and 80 weight % of water having a pH of ca. 8.5.

The light-to-heat conversion layer was then overcoated with an interlayer coating utilizing the above-described coater with a microgravure roll of 110 helical cells per lineal inch. After the interlayer was coated, it was in-line dried and uv-cured. The interlayer coating solution consisted of 19.8 weight % of a urethane-acrylate oligomer (Neorad NR-440 from Zeneca Resins, Wilmington, Mass.), 1.0 weight % of 2-hydroxy-2 methyl-1-phenyl-1-propanone photoinitiator (Darocur 1173, Ciba-Geigy, Hawthorne, N.Y.), and 79.2 weight % of water having a pH of 8.5.

The colorant transfer layer was a 15 weight % nonvolatiles content aqueous dispersion prepared by Penn Color, Doylestown, Pa., and consisted of Pigment Green 7 and Elvacite 2776 (ICI Acrylics, Inc., Wilmington, Del.) neutralized with dimethylethanolamine at a 3:2 pigment/binder ratio, containing 4 weight % Primid XL-552 (EMS American Grilon, Sumter, S.C.) relative to the polymer, and 1 weight % Triton X-100 relative to the total nonvolatiles content. This dispersion was coated onto the interlayer using a #3 coating rod and the resultant coating was dried at 80° C. for 3 minutes.

The colorant layer was then transferred to two glass slides using imaging conditions employing Laser Imaging Procedure B to produce LCD color filter elements. The colorant transferred to the glass slides (lines ca. 90 micrometers wide with a line-to-line spacing of ca. 150 micrometers) with no contamination of the carbon black layer. Microscopic examination of the donor sheet showed the carbon black composite light-to-heat conversion layer and the protective clear interlayer were intact. One of the color filter elements was then placed in an oven and heated at 200° C. in a nitrogen atmosphere for one hour in order to activate the crosslinking chemistry between the Primid XL552 and the Elvacite 2776. The other color filter element was not heated, but maintained at ambient temperature. Each of the resultant color filter elements was then cut into three ca. 25 mm×37 mm sections. One of the sections derived from each of these color filter elements was then immersed in 10 ml of 1-methyl-2-pyrrolidinone for 10 minutes. The color filter elements were then removed from the immersion solvents. The visible spectra of the solutions resulting from extractions of these color filter elements were then obtained in a quartz cuvette with a 1 cm path length on a Shimadzu MPC-3100 spectrophotometer. These spectra indicated the $\lambda_{max}$ of the color cell array extracts to be at ca. 629 nm, with good chemical resistance of each of the color cell array elements corresponding to low absorbance of its 1-methyl-2-pyrrolidinone extract at 629 nm. The corresponding results of the chemical resistance testing of the crosslinked and uncrosslinked color filter element are provided in Table 2.

TABLE 2

| Color Filter Element Designation | Absorbance of Corresponding 1-Methyl-2-Pyrrolidinone Extract (629 nm) |
|---|---|
| uncrosslinked color array | 0.53 |
| crosslinked color array | 0.04 |
| neat solvent (1-methyl-2-pyrrolidinone) | 0.04 |

The above results demonstrate the efficacy of the interlayer in improving the quality of the transferred image and the effectiveness of crosslinking the transferred coating to improve its corresponding solvent resistance.

Example 6

(Comparative Example)

This example demonstrates the preparation and use of a thermal transfer donor without an interlayer.

A carbon black light-to-heat conversion film with an absorbance of 1.35 at 1064 nm, was prepared by coating an aqueous dispersion of carbon black in a radiation curable resin onto a 2 mil PET substrate with a Yasui Seiki Lab Coater, Model CAG-150 (Yasui Seiki Co., Bloomington, Ind.) using a microgravure roll of 90 helical cells per lineal inch. The coating was subsequently in-line dried and uv-cured on the coater before windup. The coating solution consisted of 1 part of carbon black (Sunsperse black, Sun Chemical, Amelia, Ohio), 7 parts of NR-440 (a crosslinkable urethane acrylate oligomer from Zeneca Resins, Wilmington, Mass.), and 0.35 part of a photoinitiator (Darocur 1173 from Ciba-Geigy, Hawthorne, N.Y.) at 35 wt % total solid in water to give a light-to-heat conversion coating with a 4.5 µm dry thickness.

The light-to-heat conversion layer was overcoated with a clear interlayer, followed by a colorant layer. Using a #5 coating rod, an aqueous solution containing 12.5 wt % NR-440 and 0.6 wt % Darocur 1173 was coated, dried at 80° C. for 2 minutes and UV crosslinked to provide a color topcoat with a heat stable, smooth release surface. The color transfer layer was applied by coating the green color ink of Example 5 at 15 wt % total solid using a #5 coating rod and drying for 3 min at 60° C. to give a 1 µm thick colorant layer.

The donor thus prepared was tested for imagewise transfer of the thermal transfer layer to a black chrome coated glass receptor, which had an absorbance of 2.8 at 1064 nm. The color donor sheet was imaged with a line pattern and transferred onto the glass receptor (75 mm×50 mm×1.1 mm). Imaging was performed in a flat-bed imaging system, using a Nd:YAG laser operating at 7.5 W on the donor film plane with a 140 µm laser spot size ($1/e^2$ diameter). The laser scan rate was 4.5 m/s. Image data were transferred from a mass-memory system and supplied to an acoustic-optic modulator which performed the imagewise modulation of the laser. During the imaging process, the donor sheet and the receptor were held in intimate contact with vacuum assistance.

A microscopic inspection of the resultant image on the receptor indicated that the imaged lines possessed a uniform line width of 89 µm. Damage (e.g., roughened surface, cracks, bubbles, color variation, etc.) was observed to be present at the central portion of each of the transferred colorant lines.

Example 7

This example demonstrates the preparation and use of a thermal transfer donor with a vapor-coated aluminum reflective interlayer coated over a LTHC layer comprising carbon black dispersed in a crosslinked organic binder.

The donor used in this example was the same as that used in Example 6, except that a vapor-coated aluminum reflective interlayer was coated on the light-to-heat conversion layer prior to coating the color transfer layer. The aluminum coating was determined to have 85.8% reflection at 1064 nm.

The donor was tested for imagewise transfer of the thermal transfer layer to a black chrome coated glass receptor using the same method described in Example 6. A microscopic inspection of the resultant image indicated that the image lines were of good overall quality with a uniform line width of 82 μm. No obvious sign of thermal damage was observed in the central portion of the transferred lines.

Example 8

This example demonstrates the preparation and use of a thermal transfer donor with a white reflective interlayer.

The donor used in this example was the same as that used in Example 6, except that a white reflective interlayer was coated on the light-to-heat conversion layer prior to the other coatings. The white reflective layer was prepared by coating a white correction ink at 17.3 wt % total solid (Pentel Correction Pen™ ink) with a #3 coating rod, followed by drying at 80° C. for 2 min. The coating was determined to have a reflectivity of 22.5% at 1064 nm.

The donor was tested for imagewise transfer of the thermal transfer layer to a black chrome coated glass receptor using the same method described in Example 6. A microscopic inspection of the resultant image indicated that the image lines were of good overall quality with a uniform line width of 82 μm. No obvious sign of thermal damage was observed in the central portion of the transferred lines.

Example 9

The donors used in this example were the same as those used in Examples 6–8, except that a carbon black light-to-heat conversion layer with an absorbance of 0.94 at 1060 nm was used. This light-to-heat conversion layer was prepared by the same method as described in Example 6, except that the coating solution contained 27 wt % total solids instead of 35 wt %.

The donors were tested for imagewise transfer of the thermal transfer layer to a black chrome coated glass receptor using the same method described in Example 6.

The results of a microscopic inspection of the resultant images on the receptors are summarized in Table 3.

TABLE 3

Effect of Reflective Interlayer on Image Quality (5.3 m/sec Scan Speed)

| Donor | Linewidth (μm) | Damage to transferred line |
|---|---|---|
| Control | 90 | some |
| Al Interlayer | 97 | some |
| White Interlayer | 100 | none |

The results indicate that images transferred from the donor with a white interlayer (22.5% R, 46% T) suffered the least damage.

These results demonstrate the efficacy of a reflective interlayer in the improvement of transferred image quality and the prevention of thermal damage of the transferred material.

Example 10

This example demonstrates the preparation and use of a thermal transfer donor with a reflective aluminum interlayer coated over a black aluminum LTHC layer. A black aluminum (partially oxidized Al, $AlO_x$) light-to-heat conversion layer of approximately 800 Å was coated onto a 4 mil poly(ethylene terephthalate) (PET) substrate via reactive sputtering of Al in an $Ar/O_2$ atmosphere in a continuous vacuum coater according to the teachings of U.S. Pat. No. 4,430,366. Approximately 100 Å of Al was then sputtered onto the $AlO_x$ light-to-heat conversion layer in an Ar atmosphere with the same continuous vacuum coater. The resultant material containing the reflective aluminum interlayer was then overcoated with an aqueous green color ink of the composition shown in Table 4 using a #4 coating rod and dried at 60° C. to produce a thermal transfer donor.

TABLE 4

Composition of Aqueous Green Ink Coating Solution

| Coating Component | Percent by Weight |
|---|---|
| PG-7 Pigment* | 9.1 |
| ICI Elvacite 2776* | 5.3 |
| Triethyl-O-acetyl-citrate | 0.3 |
| Dimethylethanolamine | 1.1 |
| 3M FC-430 Surfactant | 0.04 |
| $H_2O$ | 84.2 |

*A dispersion of PG-7 pigment in Elvacite 2776 was obtained from Penn Color, Doylestown, PA.

This donor was then tested for thermal transfer to a glass slide receptor to produce a color filter element for a liquid crystal display. The above-described Laser Imaging Procedure A was employed and the laser spot diameter was 100 μm ($1/e^2$), the power at the film plane was 8.4 Watts, and exposures were performed at pulse widths of 4, 6 and 8 microseconds.

The results showed that the transferred images were essentially free from black aluminum contamination under the above-described imaging conditions.

Reasonable variations and modifications are possible from the foregoing disclosure without departing from either the spirit or scope of the present invention as recited in the claims.

What is claimed is:

1. A thermal transfer element comprising:
    a thermal transfer layer capable of being selectively transferred from the thermal transfer donor element when the thermal transfer donor element is exposed to imaging radiation, wherein the thermal transfer layer comprises a phosphor or fluorescent dye;
    a light-to-heat conversion layer comprising a material that absorbs imaging radiation to convert the radiation into heat; and
    an interlayer disposed between the light-to-heat conversion layer and the transfer layer;
    wherein the interlayer remains substantially intact when the thermal transfer element is exposed to imaging radiation to selectively transfer the thermal transfer layer.

2. The thermal transfer element of claim 1, wherein the thermal transfer layer comprises a phosphor.

3. The thermal transfer element of claim 1, wherein the interlayer comprises a pigment.

4. The thermal transfer element of claim 1, wherein the interlayer does not visibly distort or decompose at temperatures below 150° C.

5. The thermal transfer element of claim 1, further comprising a second interlayer disposed between the interlayer and the transfer layer.

6. The thermal transfer element of claim 5, wherein the second interlayer remains substantially intact when the thermal transfer layer is selectively transferred upon exposure of the thermal transfer element to imaging radiation.

7. The thermal transfer element of claim 1, wherein the thermal transfer layer comprises polymerizable or crosslinkable material.

8. The thermal transfer element of claim 7, wherein the polymerizable or crosslinkable material comprises monomers, oligomers, or combinations thereof.

9. The thermal transfer element of claim 7, wherein the thermal transfer layer further comprises a crosslinking agent.

10. The thermal transfer element of claim 7, wherein the thermal transfer element further comprises a polymerization or crosslinking initiator.

11. A process for transferring an image onto a receptor comprising the steps of:

providing on a substrate a light-to-heat conversion layer, a thermal transfer layer and an interlayer disposed between the light-to-heat conversion layer and the thermal transfer layer, wherein the thermal transfer layer comprises polymerizable or crosslinkable material;

placing the thermal transfer layer in contact with a surface of the receptor;

irradiating the light-to-heat conversion layer in an imagewise pattern with a light source to thermally transfer portions of the thermal transfer layer corresponding to the imagewise pattern to the receptor without transferring significant portions of the interlayer; and polymerizing or crosslinking the polymerizable or crosslinkable material of the portions of the thermal transfer layer transferred to the receptor.

12. The process of claim 11, wherein the polymerizable or crosslinkable material comprises monomers, oligomers, or combinations thereof.

13. The process of claim 11, wherein the thermal transfer layer further comprises a crosslinking agent.

14. The process of claim 11, wherein the thermal transfer layer further comprises a polymerization or crosslinking initiator.

15. The process of claim 11, wherein polymerizing or crosslinking the polymerizable or crosslinkable material comprises polymerizing or crosslinking the polymerizable or crosslinkable material of the portions of the thermal transfer layer transferred to the receptor by radiation.

16. The process of claim 11, wherein polymerizing or crosslinking the polymerizable or crosslinkable material comprises polymerizing or crosslinking the polymerizable or crosslinkable material of the portions of the thermal transfer layer transferred to the receptor by heat.

17. The process of claim 11, wherein polymerizing or crosslinking the polymerizable or crosslinkable material comprises polymerizing or crosslinking the polymerizable or crosslinkable material of the portions of the thermal transfer layer transferred to the receptor by chemical curative.

18. The process of claim 11, wherein the transfer layer comprises a phosphor or fluorescent dye.

19. A process for transferring an image onto a receptor comprising the steps of:

providing on a substrate a light-to-heat conversion layer, a thermal transfer layer and an interlayer disposed between the light-to-heat conversion layer and the thermal transfer layer, wherein the thermal transfer layer comprises a fluorescent dye or phosphor;

placing the thermal transfer layer in contact with a surface of the receptor; and irradiating the light-to-heat conversion layer in an imagewise pattern with a light source to thermally transfer portions of the thermal transfer layer corresponding to the imagewise pattern to the receptor without transferring significant portions of the interlayer.

20. The process of claim 19, wherein the thermal transfer layer comprises a phosphor.

* * * * *